United States Patent [19]

Bourg, Jr et al.

[11] Patent Number: 5,424,581
[45] Date of Patent: Jun. 13, 1995

[54] CRATER PREVENTION TECHNIQUE FOR SEMICONDUCTOR PROCESSING

[75] Inventors: Haden J. Bourg, Jr, Roanoke; Jim A. McNelis, Arlington, both of Tex.; Peter Weiler, Palo Alto, Calif.

[73] Assignee: National Semiconductor, Santa Clara, Calif.

[21] Appl. No.: 277,364

[22] Filed: Jul. 19, 1994

Related U.S. Application Data

[60] Continuation of Ser. No. 149,670, Dec. 20, 1993, abandoned, which is a division of Ser. No. 910,702, Jul. 8, 1992, Pat. No. 5,316,976.

[51] Int. Cl.⁶ ................... H01L 23/48; H01L 29/40
[52] U.S. Cl. ................... 257/786; 257/754; 257/760
[58] Field of Search ............ 257/784, 786, 758–760, 257/754, 755

[56] References Cited

U.S. PATENT DOCUMENTS

| | | | |
|---|---|---|---|
| 4,810,666 | 3/1989 | Taji | 437/30 |
| 4,916,084 | 4/1990 | Shibata | 437/41 |
| 5,084,752 | 1/1992 | Satoh et al. | 257/786 |
| 5,094,980 | 3/1992 | Shepela | 437/189 |

FOREIGN PATENT DOCUMENTS

| | | | |
|---|---|---|---|
| 0340727 | 11/1989 | European Pat. Off. | 257/786 |
| 0395072 | 10/1990 | European Pat. Off. | 257/784 |
| 0418777 | 3/1991 | European Pat. Off. | 257/784 |
| 0490506 | 6/1992 | European Pat. Off. | 257/784 |
| 0018060 | 1/1987 | Japan | 257/786 |
| 0067753 | 3/1988 | Japan. | |

OTHER PUBLICATIONS

Bond Pad Structure Reliability, Ching et al., IEEE/IRPS 1988, pp. 64–70.
VLSI Fabrication Principles, S. Ghandhi, Rensselaer Polytechnic Institute pp. 432–435.
A Bond Failure Mechanism, Koch et al., IEEE/IRPS 1986, pp. 55–60.

*Primary Examiner*—Rolf Hille
*Assistant Examiner*—Peter Toby Brown
*Attorney, Agent, or Firm*—Steven F. Caserza; Flehr Hohbach Test Albritton & Herbert

[57] ABSTRACT

A semiconductor bond pad prevents cratering by including an etch stop layer which is formed between the field oxide layer and the first dielectric layer to prevent erosion of the field oxide while allowing etching and removal of the first dielectric layer to prevent cratering.

4 Claims, 7 Drawing Sheets

CRATER PREVENTION TECHNIQUE FOR SEMICONDUCTOR PROCESSING

This application is a continuation of Ser., No. 08/149,670, filed Dec. 20, 1993, now abandoned, which in turn is a divisional of Ser. No. 07/910,702, filed Jul. 8, 1992, now U.S. Pat. No. 5,316,976.

TECHNICAL FIELD

This invention relates to semiconductor processing techniques used to fabricate integrated circuits.

BACKGROUND

During the wire bonding operation in the assembly of semiconductor devices, or in the subsequent operations where stress is applied to the bond pad, cratering can occur in the structure under the bond because of the weakness in the dielectric structure immediately under the metal layer of the bond pad. Cratering occurs, for example, when the dielectric layer under the bond metal cracks causing the bond pad to separate from the integrated circuit, thereby causing a failure of the chip. Cratering may extend into the field oxide layer below the dielectric layer, or even into the silicon substrate. Thus, although the dielectric layer is necessary for the forming of other structures in the integrated circuit, the dielectric layer does not serve any useful function in the bond pad structure, and it is therefore desirable to subsequently etch the dielectric from under the bond pad to prevent cratering.

In the prior art bond pad formation techniques, a dielectric layer is typically formed on top of a layer of field oxide of the integrated circuit. The dielectric layer is then etched in the bond pad area to avoid cratering. However, during the etching of the dielectric layer, etching into the field oxide may also result. Any etching of the field oxide is undesirable since this typically causes performance, yield, or reliability problems. Also known in the prior art is the use of a polycrystalline silicon layer instead of the dielectric layer under the bond pad. However, because polycrystalline silicon is structurally weak, the same cratering problems also occur.

FIG. 1 illustrates one example of a prior art bond pad structure. Bond pad 10 typically comprises the following layers arranged in the manner shown in FIG. 1: field oxide 20 over silicon 60, first dielectric (D1) layer 21 over field oxide 20, first metal layer 15 over first dielectric layer 21, second dielectric (D2) layer 22 over first metal 15 and first dielectric layer 21, second metal layer 25 over second dielectric layer 22 and first metal layer 15, and passivation layer 50 over second metal layer 25 and second dielectric layer 22.

FIGS. 2a–2k illustrate a prior art semiconductor fabrication process for forming bond pad 10. Referring to FIG. 2a, field oxide 20 is first formed over silicon 60. Following the step of field oxide formation, first dielectric layer 21 is then formed over field oxide 20 as shown in FIG. 2b. FIG. 2c shows the next step of forming first metal layer 15 over first dielectric layer 21. Then as illustrated in FIGS. 2d and 2e, first metal layer 15 is masked with mask layer 23, and then etched to define bond pad site 11.

The process steps shown in FIGS. 2b–2e are then repeated as shown in FIGS. 2f–2k for the formation of second dielectric layer 22 and second metal layer 25. FIG. 2f illustrates forming second dielectric layer 22 over metal layer 15. FIGS. 2g and 2h then show second dielectric layer 22 masked with photoresist mask 16 and etched to define bond pad site 11. FIG. 2i illustrates the next process step of forming second metal layer 25 over etched second dielectric layer 22. Then as illustrated in FIG. 2j, second metal layer 25 is also masked and etched to define bond pad site 11. FIG. 2k shows passivation layer 50 being subsequently formed over etched second metal layer 25 to form bond pad 10.

Ching, et al., Bond Pad Structure Reliability, IEEE-/IRPS, CH2508-00, at 64–70 (1988) describes three bond pad structures. One structure comprises a first metal layer over a dielectric layer, the dielectric layer being formed over a field oxide layer, and the field oxide layer formed over a substrate layer. A second bond pad structure shown by Ching differs from the first described bond pad structure by the removal of the dielectric layer from between the first metal layer and the field oxide layer. A third bond pad structure depicted differs from the first bond pad structure by the formation of a titanium tungsten (TiW) layer between the dielectric layer and the metal layer. Ching indicated that of the three described bond pad structures the third bond pad structure with a TiW layer and the dielectric layer intact was the superior bond pad structure to avoid cratering.

With the prior art bond pad formation techniques, cratering can occur during wire bonding or during chip operation due to the inherent weakness of first dielectric layer 21. Dielectric layer 21 is typically selected from one of the following materials such as LTD (Low Temp silicon), BPSG (Boron Phosphorous Silicon Glass), or other silicon glass. Removing dielectric layer 21 prevents cratering from occurring on the integrated circuit. However, in the prior art semiconductor fabrication process, removing dielectric layer 21 may result in damaging field oxide layer 20, causing performance, yield or reliability problems with the integrated circuit. It is therefore desirable to provide a semiconductor fabrication process for preventing cratering without damage to the field oxide layer.

SUMMARY OF THE INVENTION

A semiconductor fabrication process is provided which creates a bond pad structure that minimizes cratering of the bond pad by including an etch stop layer between the dielectric or polycrystalline silicon layer and the field oxide to avoid damage to the field oxide during removal of the dielectric or polycrystalline silicon from under the bond pad. With the use of an etch stop, the field oxide layer is not damaged during the etching process of the first dielectric layer. Moreover, a stronger bond pad structure which avoids cratering is formed by having first metal layer directly over the structurally stronger etch stop layer, rather than over the weaker structure of the dielectric or polycrystalline silicon layer.

DESCRIPTION OF SPECIFIC EMBODIMENTS

Figure 1:
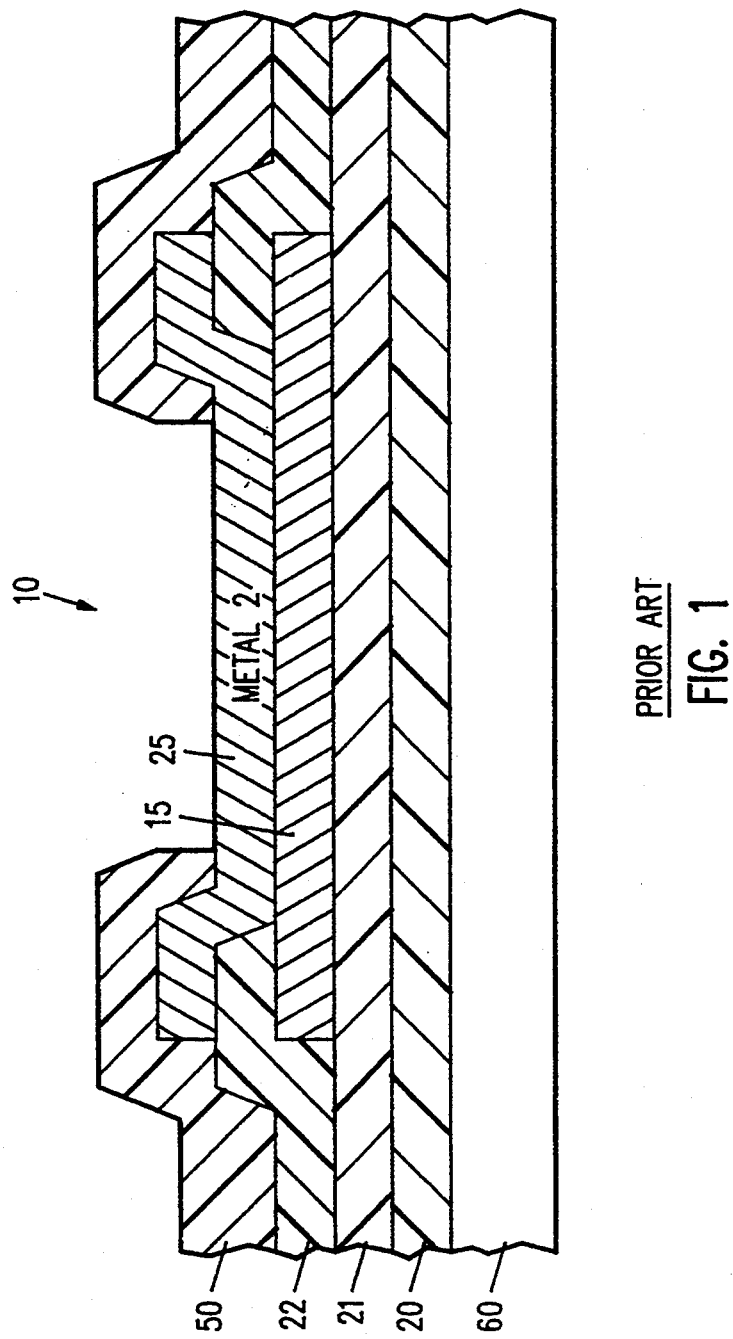
FIG. 1 illustrates a prior art bond pad structure.
Figure 2A:
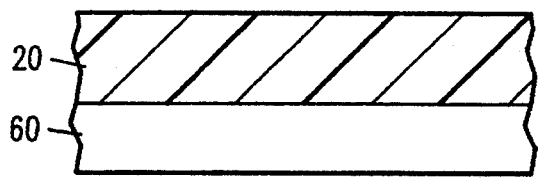
FIGS. 2a–2k show a prior art bond pad semiconductor fabrication process.
Figure 2D:
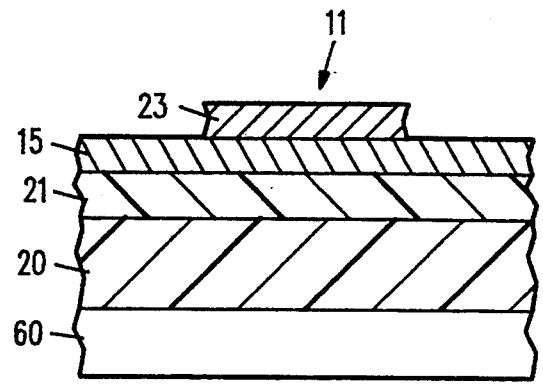
Figure 2B:
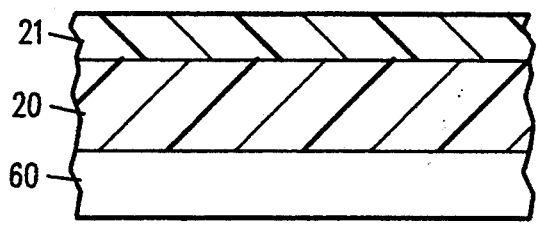
Figure 2E:
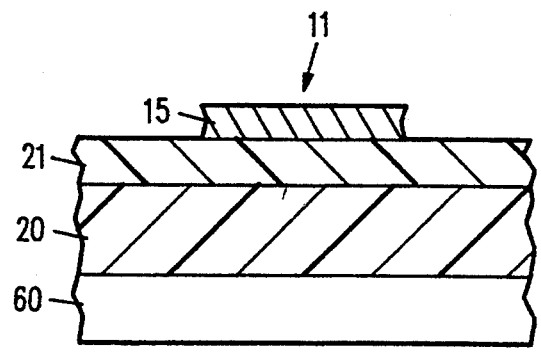
Figure 2C:
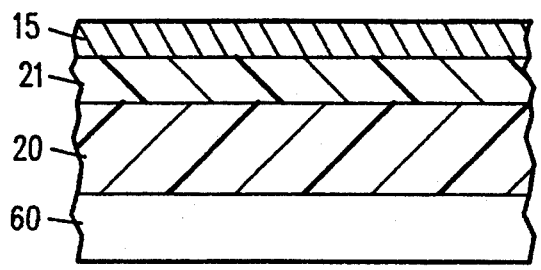
Figure 2F:
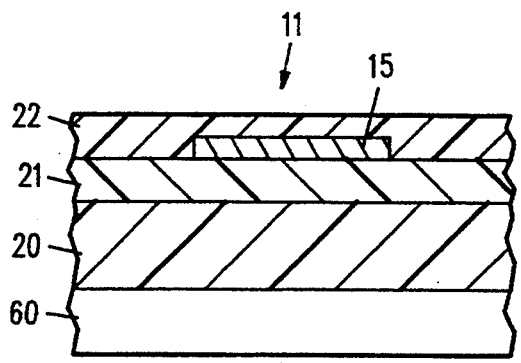
Figure 2I:
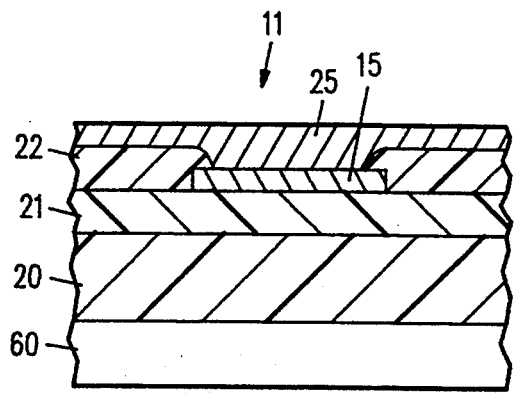
Figure 2G:
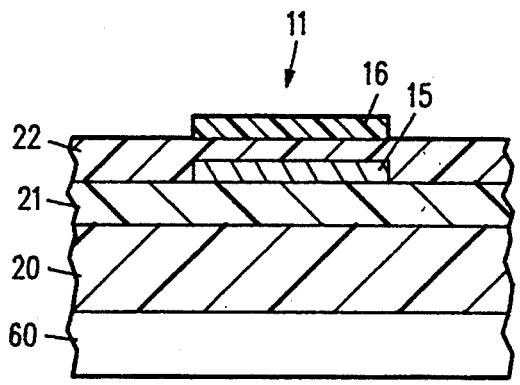
Figure 2J:
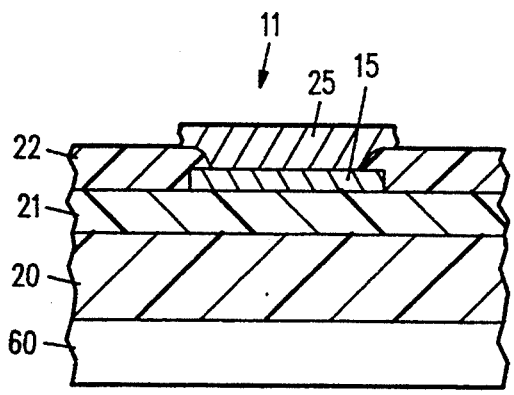
Figure 2H:
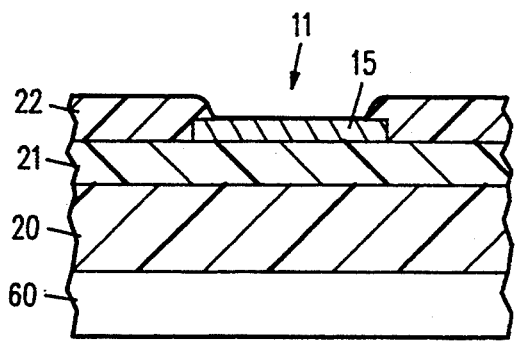
Figure 2K:
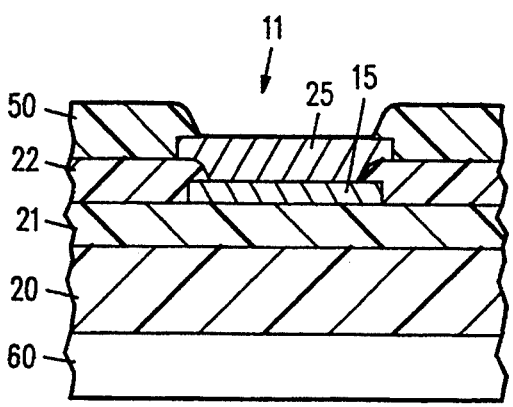
Figure 3:
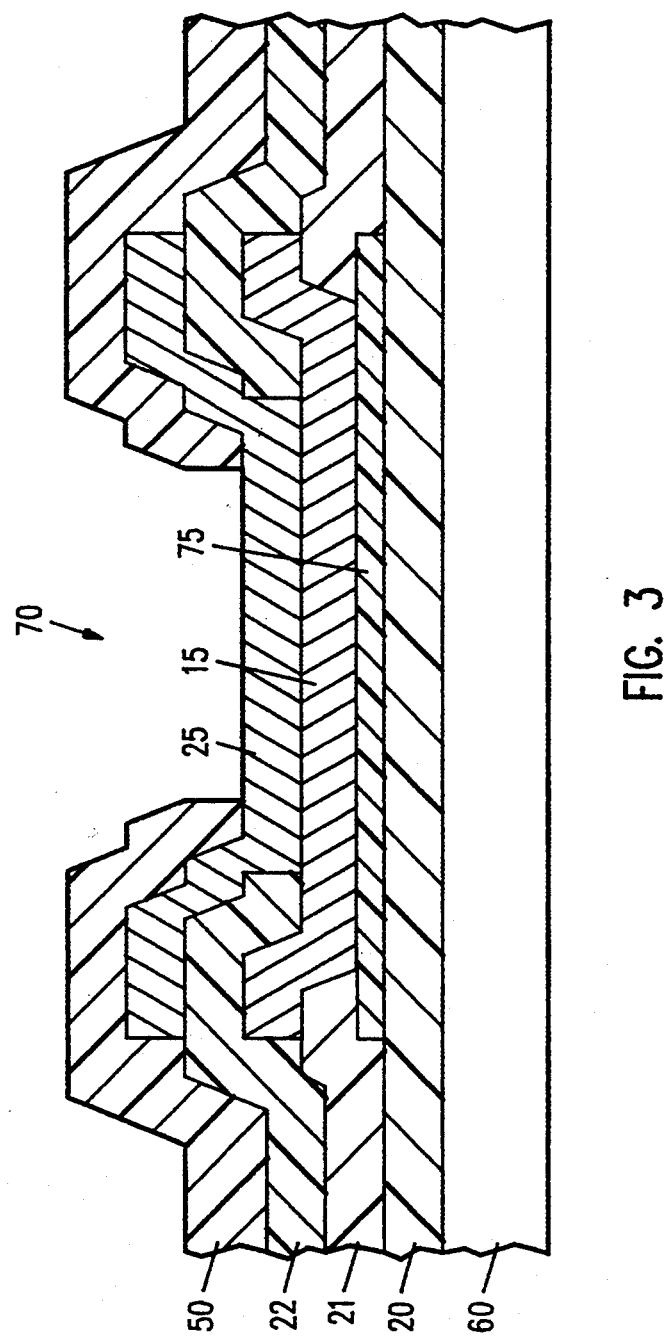
FIG. 3 illustrates one embodiment of a bond pad structure formed with the semiconductor fabrication process taught in accordance with the principles of this invention.

FIG. 3 shows one embodiment of a bond pad structure formed with a semiconductor fabrication process taught in accordance with the principles of this invention. Field oxide 20 is first formed over silicon 60. Bond pad 70 comprises nitride layer 75 over field oxide layer 20, with first dielectric or polycrystalline silicon layer 21 formed over nitride layer 75, first metal layer 15 formed over first dielectric layer 21 and nitride layer 75, and second dielectric layer 22 formed over first metal layer 15 and dielectric layer 21. Second metal layer 25 is formed over second dielectric layer 22 and first metal layer 15, with passivation layer 50 formed over second metal layer 25 and second dielectric layer 22. During chip fabrication, first dielectric layer 21 is masked to define the location of bond pad 70. Dielectric formed in this predefined site for bond pad 70 is then etched away to provide a bond pad structure which is inherently stronger and thus avoids cratering during the wirebonding process or during subsequent chip operation. Nitride layer 75 provided under first dielectric layer 21 and over field oxide layer 20 acts as an etch stop to prevent erosion into field oxide layer 20 during the etching step used to remove first dielectric layer 21.

Figure 4A:
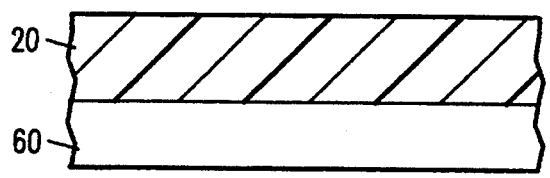
FIGS. 4a-4m show one embodiment of a bond pad semiconductor fabrication process in accordance with the principles of this invention.
Figure 4D:
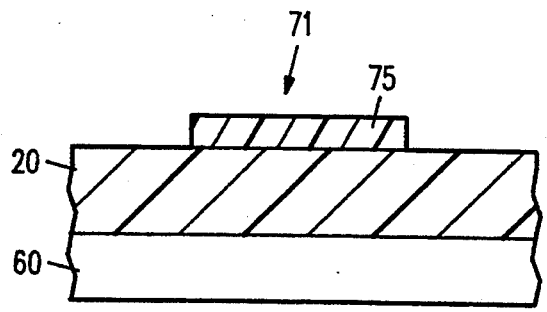
Figure 4B:
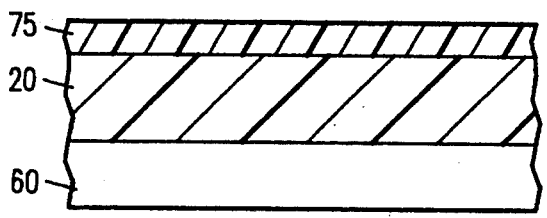
Figure 4E:
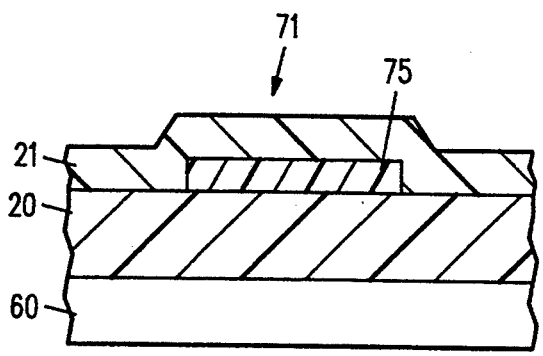
Figure 4C:
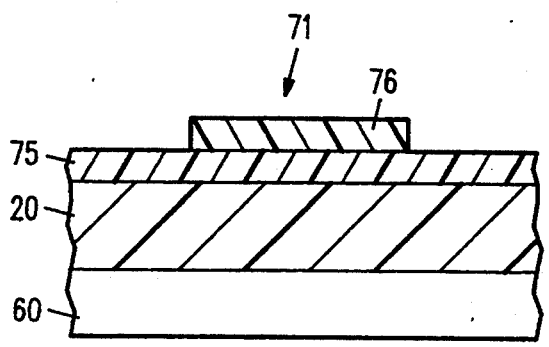
Figure 4F:
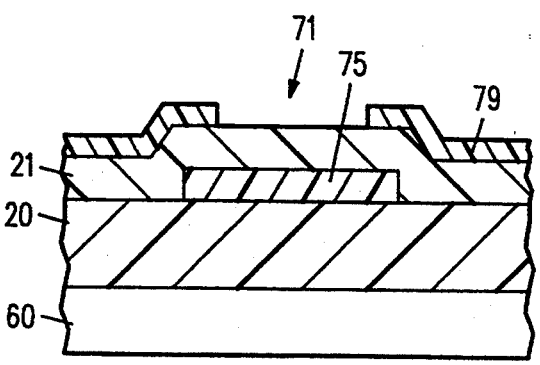
Figure 4G:
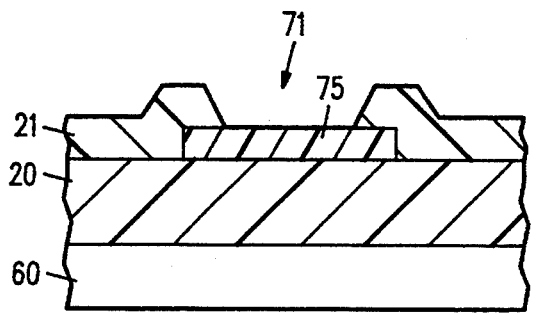

FIGS. 4a-4m illustrate one embodiment of a semiconductor fabrication process taught in accordance with the principles of this invention. FIGS. 4a and 4b illustrate the initial steps to form bond pad 70. Field oxide 20 is first formed over silicon substrate 60 with nitride layer 75 formed over field oxide layer In one embodiment, nitride layer 75 is formed to a thickness of approximately 3000 angstroms. It is also envisioned as within the scope of the principles of this invention to substitute nitride with other materials to form etch stop layer 75. As shown in FIG. 4c, in the next process step, photoresist mask 76 is formed over nitride layer 75, and then mask 76 is exposed to define bond pad site 71, where bond pad 70 is to be formed. As shown in FIG. 4d, nitride layer 75 is etched where exposed by the photoresist and the photoresist is removed. First dielectric layer 21 is then formed over nitride layer 75 as illustrated in FIG. 4e. As shown in FIG. 4f, photoresist layer 79 is formed and patterned to expose bond pad region 71. Referring to FIG. 4g, an etching step follows whereby the exposed portions of first dielectric layer 21 not masked by photoresist layer 79 is then etched from bond pad region 71. First metal layer 15 is then formed over nitride layer 75, and first metal layer 15 is then also masked and etched, defining generally bond pad site 71 as illustrated in FIG. 4h.

In an alternative embodiment envisioned as within the scope of the principles taught by this invention, etch stop layer 75 is subsequently etched and removed from bond site 71 following the etching step of first dielectric layer 21. Thus, once nitride layer 75 has served its purpose, such as an etch stop layer during the etching step of first dielectric layer 21, nitride layer is removed and first metal layer 15 may be subsequently formed directly over field oxide layer 20.

Figure 4I:
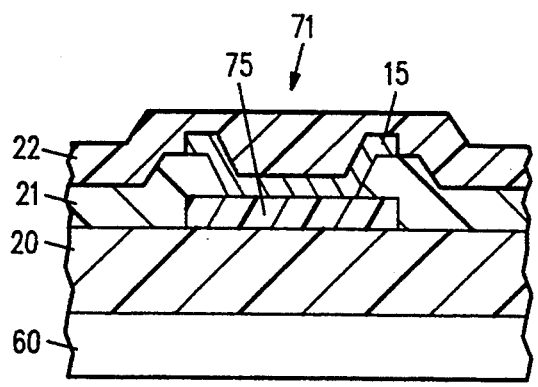
Figure 4H:
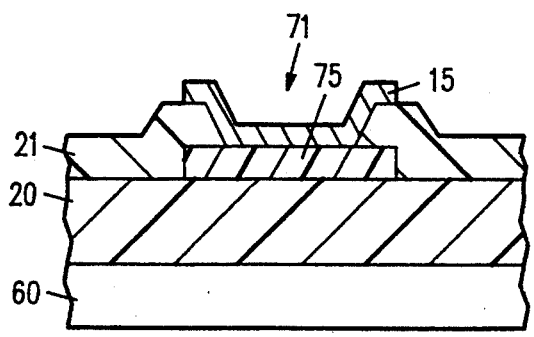
Figure 4J:
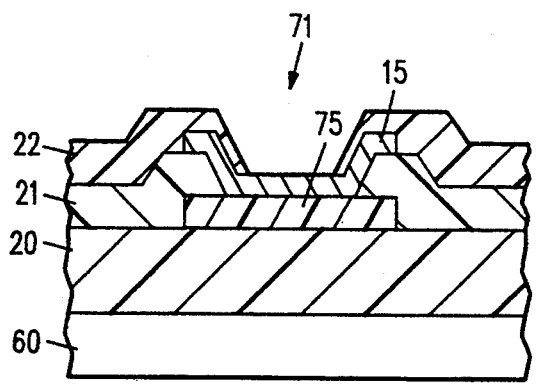
Figure 4K:
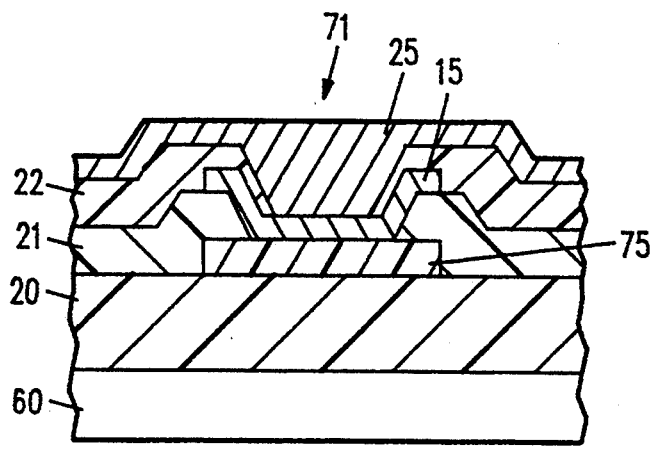
Figure 4L:
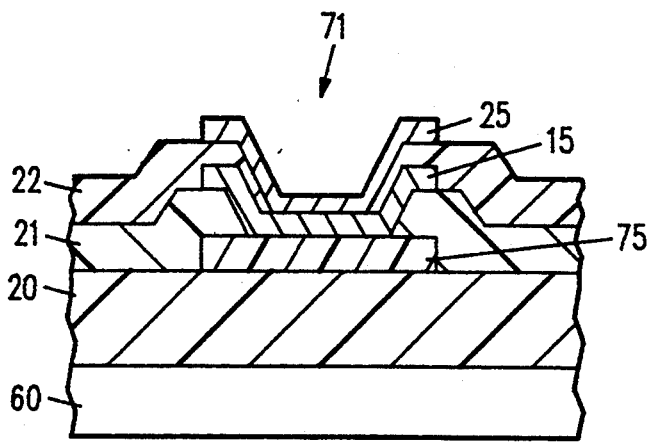
Figure 4M:
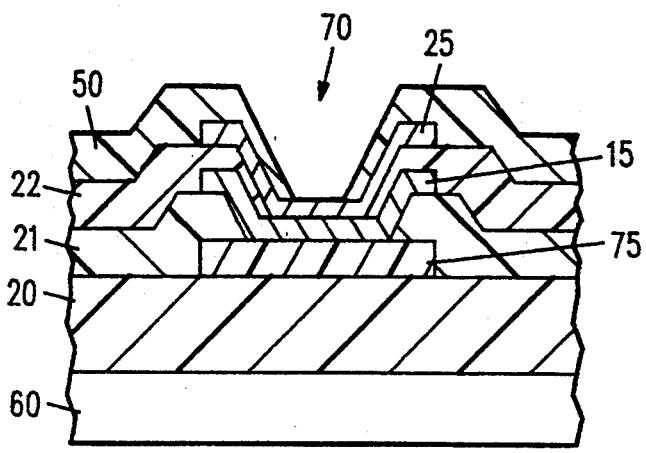

The process steps shown in FIGS. 4e-4h are similarly repeated as shown in FIGS. 4i-4m for the formation of second dielectric layer 22 and second metal layer 25. Thus, as shown in FIG. 4i, the next process step forms second dielectric layer 22 over first metal layer 15. As shown in FIG. 4j, the second dielectric layer 22 is etched to remove second dielectric layer 22 from bond pad site 71. FIG. 4k then shows the next process step of forming second metal layer 25 over first metal layer 15. As illustrated in FIG. 4l, second metal layer 25 is also masked and etched to define bond pad site 71. After etching second metal layer 25, formed in bond pad site 71 are second metal layer 25 over first metal layer 15, etch stop layer 75 directly under first metal layer 15 and above field oxide layer 20, and field oxide layer 20 directly over silicon layer 60. FIG. 4m illustrates passivation layer 50 formed over etched second metal layer 25 and then subsequently etched from bond pad site 71 to define resulting bond pad 70. Resulting bond pad 70 thus described avoids cratering problems since dielectric layer 21 used during the intermediate semiconductor process steps are removed from bond pad site 71.

Thus, the semiconductor process and bond pad structure described in accordance with the principles of this invention prevents cratering by providing etch stop layer 75 to prevent undesirable erosion of field oxide layer 20 during etching of first dielectric layer 21. It is considered as within the scope of the principles taught by this invention that other material such as polycrystalline silicon may be used in place of dielectric, while other materials which are functionally similar to nitride may be used in place of nitride to form etch stop layer 75.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A structure comprising:
   a substrate;
   a field oxide layer on said substrate;
   an etch stop layer formed over said field oxide layer at a bond pad location, said etch stop layer comprising nitride;
   a first polycrystalline silicon layer formed over only the periphery of said etch stop layer at said bond pad location and extending above said field oxide layer adjacent said bond pad location; and
   a first metal layer formed over said etch stop layer over said field oxide layer at said bond pad location and in contact with said first polycrystalline silicon layer.

2. A structure as in claim 1 further comprising at least one additional metal layer over said first metal layer.

3. A structure as in claim 2 further comprising a passivation layer over said metal layers.

4. A structure as in claim 1 wherein said first polycrystalline silicon layer is also in contact with a sidewall of said etch stop layer.

* * * * *